(12) United States Patent
Fujikawa

(10) Patent No.: US 11,624,957 B2
(45) Date of Patent: Apr. 11, 2023

(54) ELECTRO-OPTICAL PANEL, ELECTRO-OPTICAL DEVICE, AND ELECTRONIC DEVICE

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/405,010

(22) Filed: Aug. 17, 2021

(65) Prior Publication Data

US 2022/0057669 A1 Feb. 24, 2022

(30) Foreign Application Priority Data

Aug. 18, 2020 (JP) .............................. JP2020-137859

(51) Int. Cl.
| | | |
|---|---|---|
| G02F 1/1345 | (2006.01) | |
| G02F 1/1333 | (2006.01) | |
| H05K 1/02 | (2006.01) | |
| G02F 1/03 | (2006.01) | |

(52) U.S. Cl.
CPC ...... *G02F 1/13452* (2013.01); *G02F 1/13458* (2013.01); *G02F 1/0305* (2013.01); *G02F 1/133305* (2013.01); *G09G 2300/0426* (2013.01); *H05K 1/028* (2013.01); *H05K 1/0216* (2013.01)

(58) Field of Classification Search
CPC .............. G02F 1/1345; G02F 1/13452–13458
See application file for complete search history.

(56) References Cited

U.S. PATENT DOCUMENTS

| | | | | |
|---|---|---|---|---|
| 2002/0109814 | A1* | 8/2002 | Murahashi | .......... G02F 1/13452 349/151 |
| 2014/0184966 | A1* | 7/2014 | Ogasawara | ........... G02F 1/1309 349/33 |
| 2017/0184903 | A1 | 6/2017 | Fujikawa | |
| 2018/0228018 | A1 | 8/2018 | Yoshii | |

FOREIGN PATENT DOCUMENTS

| | | |
|---|---|---|
| JP | 2007087999 | 4/2007 |
| JP | 2017120299 | 7/2017 |
| JP | 2018128498 | 8/2018 |
| JP | 2020016762 | 1/2020 |
| JP | 2020134855 | 8/2020 |

\* cited by examiner

*Primary Examiner* — Dung T Nguyen
(74) *Attorney, Agent, or Firm* — JCIPRNET

(57) ABSTRACT

An electro-optical panel including a display region includes a first terminal group including a plurality of first terminals arranged along a first side of a liquid crystal panel; and a second terminal group disposed between the first terminal group and the display region and including a plurality of second terminals arranged along the first side, in which the number of the plurality of second terminals is smaller than the number of the plurality of first terminals.

16 Claims, 13 Drawing Sheets

ELECTRO-OPTICAL PANEL, ELECTRO-OPTICAL DEVICE, AND ELECTRONIC DEVICE

The present application is based on, and claims priority from JP Application Serial Number 2020-137859, filed on Aug. 18, 2020, the disclosure of which is hereby incorporated by reference herein in its entirety.

BACKGROUND

1. Technical Field

The present disclosure relates to an electro-optical panel, an electro-optical device, and an electronic device.

2. Related Art

As an electro-optical device, there is an active-drive-type liquid crystal device that includes a switching element at a pixel. Such a liquid crystal device is used, for example, as a light valve of a projector serving as an electronic device.

In the liquid crystal device, for example, a flexible wiring substrate (flexible printed circuit: FPC) is coupled to a liquid crystal panel in order to supply an image signal or the like. For example, in JP-A-2018-128498, a first terminal group and a second terminal group, which are used for a plurality of terminals, are disposed sequentially from an end portion side of the liquid crystal panel. Specifically, a first sheet of flexible wiring substrate is coupled to the first terminal group. A second sheet of flexible wiring substrate is coupled to the second terminal group so as to overlap with the first sheet of flexible wiring substrate. In other words, multiple stages of flexible wiring substrates are mounted on the liquid crystal panel.

However, terminals are arranged at narrow pitches in association with a reduction in the size of the liquid crystal panel. This makes a connection defect more likely to occur due to misalignment at the time of coupling the liquid crystal panel to the flexible wiring substrate. In this case, it is possible to repair the connection defect, for example, by applying heat to the connected portion of the flexible wiring substrate to detach it, and then, mounting a new flexible wiring substrate again. However, when the first sheet of flexible wiring substrate is mounted as a conforming item and then the second sheet of flexible wiring substrate results in a connection defect, it is difficult to re-mount only the second sheet of flexible wiring substrate without affecting the mounting of the first sheet of flexible wiring substrate because the first terminal group and the second terminal group are disposed on the same side of the liquid crystal panel and also are close to each other. This leads to re-mounting of both the first sheet of flexible wiring substrate and the second sheet of flexible wiring substrate, doubling the repair cost. This results in a problem in that the mounting yield for the second sheet of flexible wiring substrate is desired to be enhanced.

SUMMARY

An electro-optical panel provides an electro-optical panel including a display region, and includes a first terminal group including a plurality of first terminals arranged along a first side of the electro-optical panel, and a second terminal group disposed between the first terminal group and the display region and including a plurality of second terminals arranged along the first side, in which the number of the plurality of second terminals is smaller than the number of the plurality of first terminals.

An electro-optical device includes the electro-optical panel described above, a first wiring substrate including a first external terminal electrically coupled to the first terminal of the first terminal group, and a second wiring substrate including a second external terminal electrically coupled to the second terminal of the second terminal group, in which a difference between a width of the second terminal and a width of the second external terminal is greater than a difference between a width of the first terminal and a width of the first external terminal.

An electronic device includes the electro-optical device described above.

DESCRIPTION OF EXEMPLARY EMBODIMENTS

First Embodiment

Figure 1:
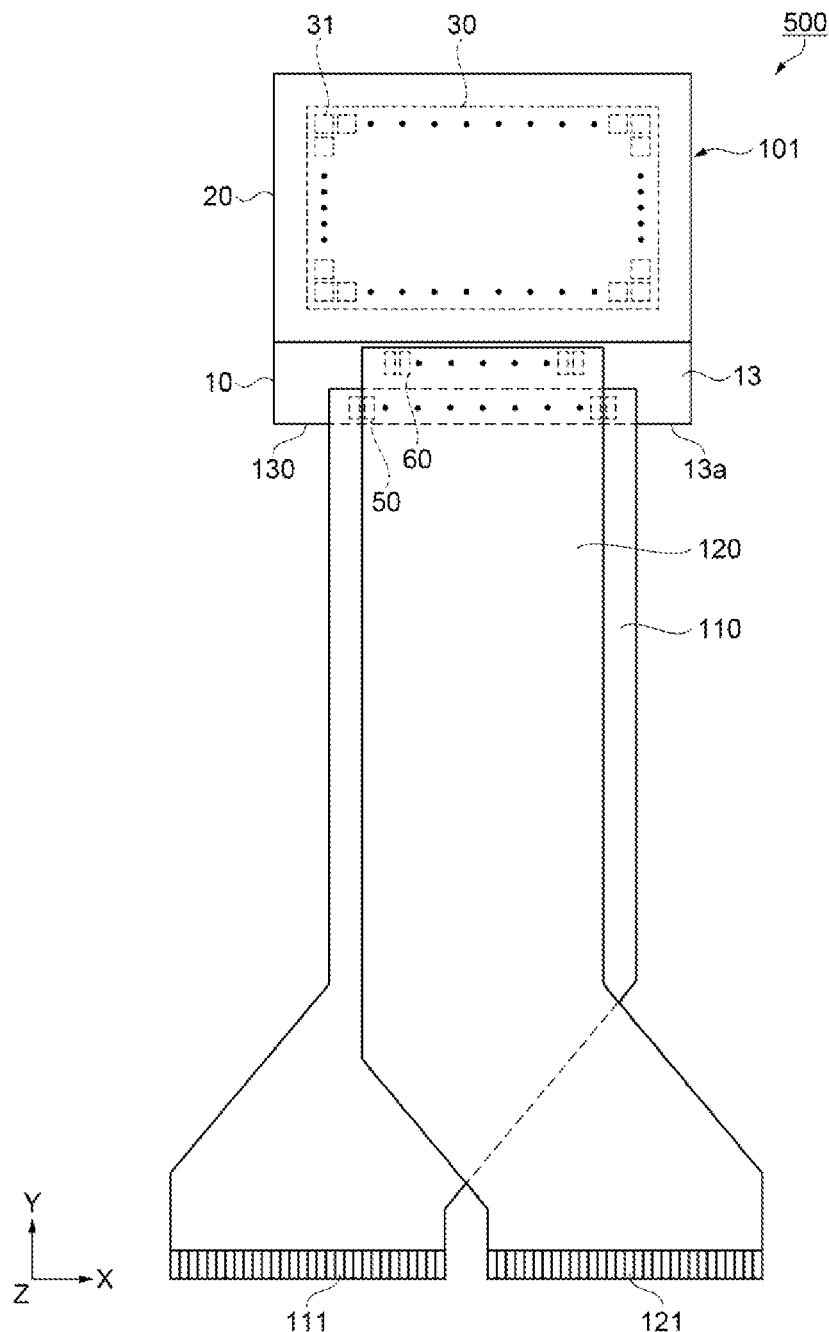
FIG. 1 is a plan view illustrating a configuration of a liquid crystal device.
Figure 2:
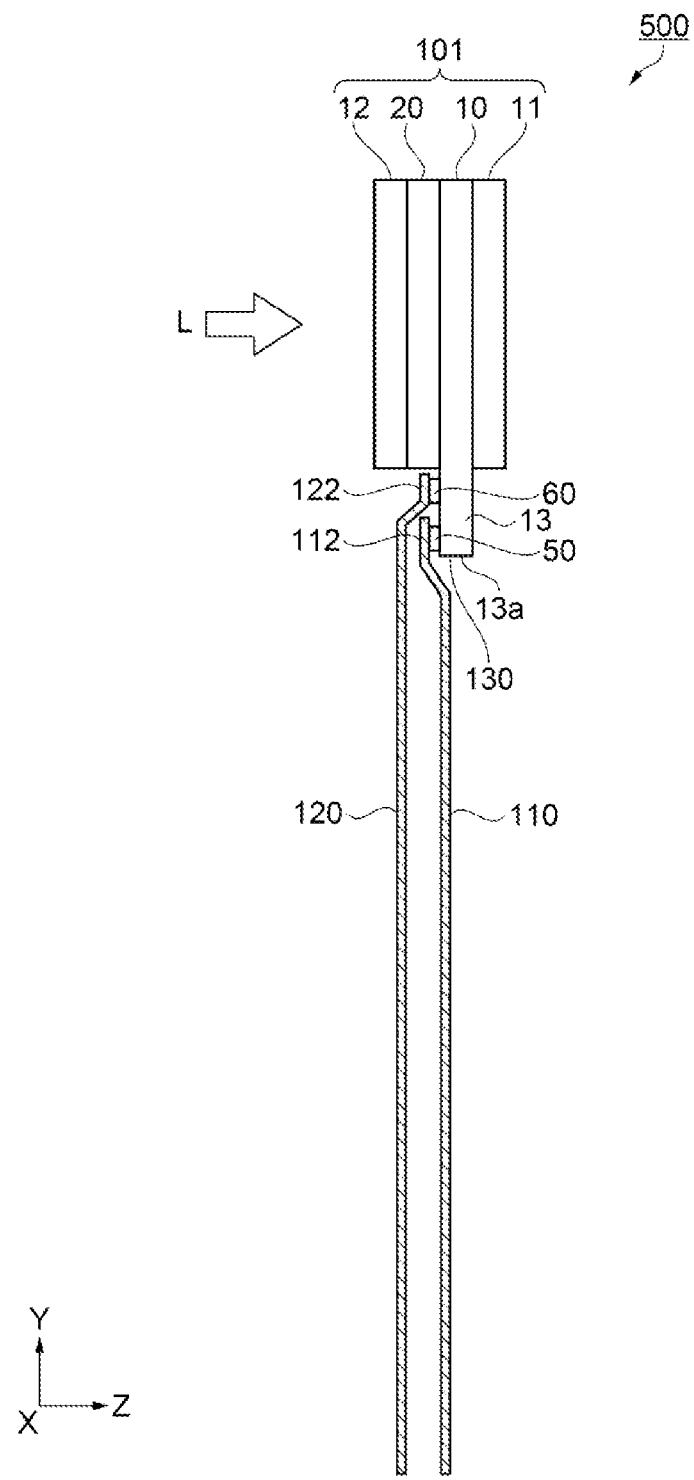
FIG. 2 is a side view illustrating the liquid crystal device illustrated in FIG. 1.

As illustrated in FIGS. 1 and 2, a liquid crystal device 500 serving as an electro-optical device includes: a liquid crystal panel 101 serving as an electro-optical panel; a first connection wiring substrate 110 serving as a first wiring substrate; and a second connection wiring substrate 120 serving as a second wiring substrate. The first connection wiring substrate 110 and the second connection wiring substrate 120 are each coupled to a terminal portion 13 at a first side 130 of the liquid crystal panel 101. Note that, in FIGS. 1 and 2, omission is made as appropriate in a manner that does not cause any problem in description of the configuration, operations, and effects of the present disclosure. The liquid crystal device 500 is used, for example, as a light valve of a projector 1000 serving as an electronic device that will be described later.

As illustrated in FIG. 1, the liquid crystal panel 101 includes a plurality of pixels 31 arranged in a matrix manner with a row direction being an X direction and a column direction being a Y direction in the display region 30. The liquid crystal panel 101 is an active-drive-type panel.

Although illustration is not given, a pixel 31 includes a pixel electrode, a switching element, a counter electrode, and a retention capacitor in a corresponding manner. The switching element performs switching control to the pixel electrode. The counter electrode is opposed to the pixel electrode with a liquid crystal layer being disposed therebetween. The pixel electrode, the switching element, and the retention capacitor are provided on the element substrate 10. The switching element is, for example, a thin film transistor (TFT). The counter electrode is provided on a counter substrate 20 at least over the display region 30 so as to be opposed to a plurality of pixel electrodes. The pixel electrodes and the counter electrode are formed, for example, using an electrically conducting transparent film made of indium tin oxide (ITO) or indium zinc oxide (IZO).

A first terminal group 50 and a second terminal group 60 are provided at the terminal portion 13 of the element substrate 10. The first connection wiring substrate 110 is electrically coupled to the first terminal group 50. For example, the first connection wiring substrate 110 has an end portion formed so as to be bent toward one side. The second connection wiring substrate 120 is electrically coupled to the second terminal group 60. For example, the second connection wiring substrate 120 includes an end portion formed so as to be bent toward the other side.

An input terminal 111 is provided at an end portion of the first connection wiring substrate 110. An input terminal 121 is provided at an end portion of the second connection wiring substrate 120. The input terminal 111 and the input terminal 121 are each electrically coupled to any of or all of upper-layer devices such as a power-supply circuit, a control circuit, or a signal processing circuit of the projector 1000. The first connection wiring substrate 110 and the second connection wiring substrate 120 are, for example, flexible substrates such as a flexible printed circuit (FPC). Note that, although illustration is not given, a driving IC is mounted on the first connection wiring substrate 110.

As illustrated in FIG. 2, a first dust protection substrate 11 is disposed at the element substrate 10 side of the liquid crystal panel 101. A second dust protection substrate 12 is disposed at the counter substrate 20 side of the liquid crystal panel 101. The element substrate 10 has a substrate size larger than the counter substrate 20. The terminal portion 13 of the element substrate 10 is provided at the first side 130 of the element substrate 10 that juts out from the counter substrate 20. The first terminal group 50 and the second terminal group 60 are provided in this order at the terminal portion 13 so as to be spaced apart by a predetermined gap from an end portion 13a of the element substrate 10 on the first side 130 side.

A first connection terminal group 112 including a first connection terminal 113 (see FIG. 5) serving as a plurality of first external terminals is provided at the first connection wiring substrate 110. A second connection terminal group 122 including a second connection terminal 123 (see FIG. 6) serving as a plurality of second external terminals is provided at the second connection wiring substrate 120. Note that FIG. 2 illustrates portions of the first connection terminal group 112 and the second connection terminal group 122 that achieve the electrical coupling to the element substrate 10. In addition, the first connection terminal 113 and the second connection terminal 123 are portions of the copper foil patterns that extend in the longitudinal direction of each of the connection wiring substrates.

The first connection wiring substrate 110 is coupled to the first terminal group 50. The second connection wiring substrate 120 is coupled to the second terminal group 60. The first terminal group 50 and the first connection terminal group 112 of the first connection wiring substrate 110 are electrically coupled to each other, for example, through an anisotropic conductive film (ACF). In a similar manner, the second terminal group 60 and the second connection terminal group 122 of the second connection wiring substrate 120 are electrically coupled to each other, for example, through an ACF.

The second connection wiring substrate 120 is mounted at the terminal portion 13 of the element substrate 10 so as to overlap with the first connection wiring substrate 110 that has been previously mounted. In addition, the second connection wiring substrate 120 is mounted at the second terminal group 60 so as to be shifted with respect to the first connection wiring substrate 110 in a manner that corresponds to placement of the first terminal group 50 and the second terminal group 60 at the terminal portion 13. Thus, once the first connection wiring substrate 110 and the second connection wiring substrate 120 are mounted at the terminal portion 13, the substrate surfaces of these substrates are opposed to each other. Light L enters, for example, from the counter substrate 20 side.

Figure 3:
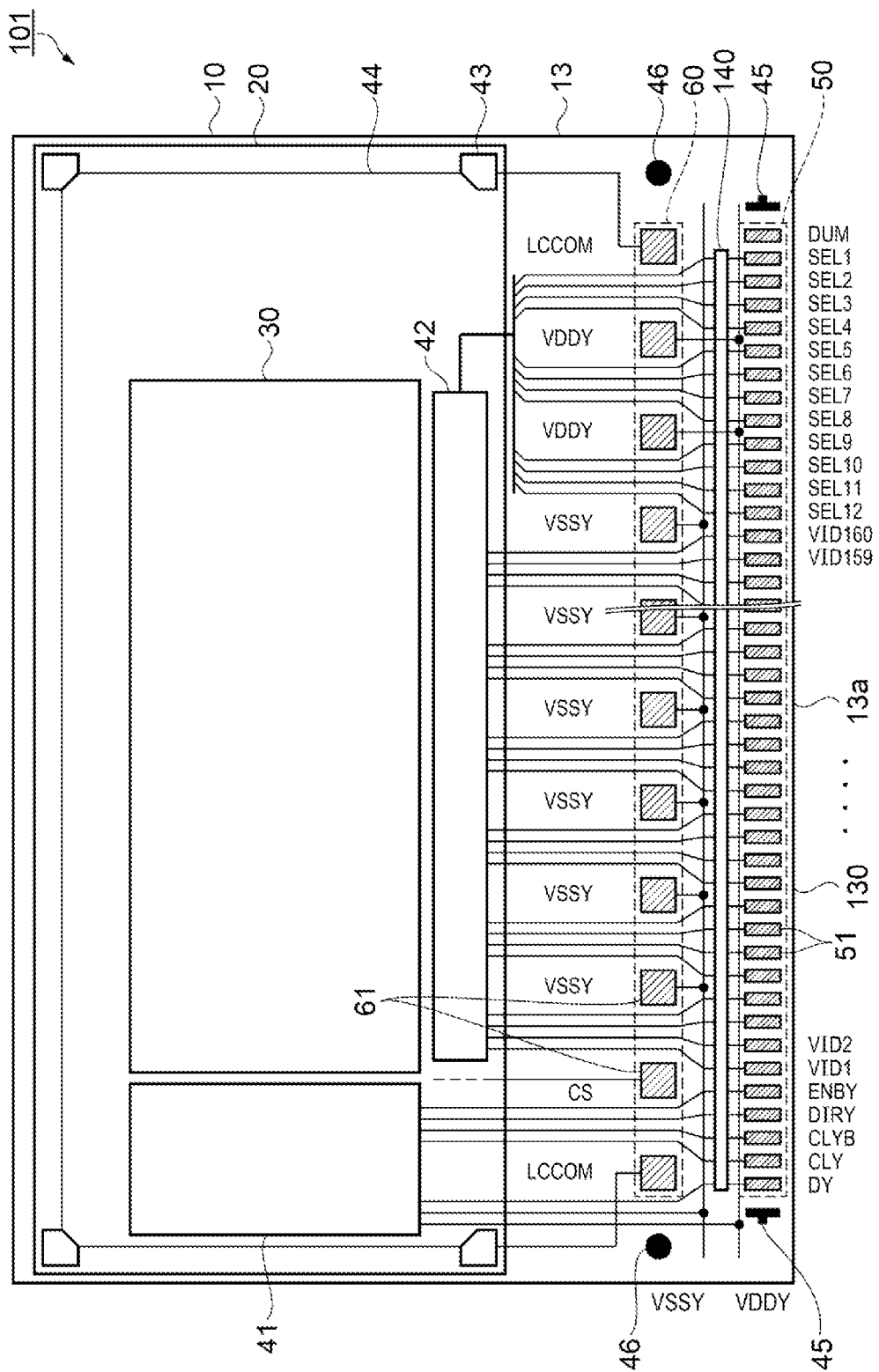
FIG. 3 is a plan view illustrating a configuration of a liquid crystal panel according to a first embodiment.

As illustrated in FIG. 3, in a case of the liquid crystal panel 101 according to the first embodiment, the first terminal group 50 and the second terminal group 60 are arranged in this order from the end portion 13a side of the terminal portion 13 as described above. The liquid crystal panel 101 is configured with, for example, demultiplex drive, and includes a scanning line driving circuit 41 and a data line driving circuit 42. For example, the data line driving circuit 42 is a switch array for which selection is made using 12 pieces of demultiplexer selection signals SEL1 to SEL12, and includes 160 pieces of demultiplexers. With the demultiplexer selection signals SEL1 to SEL12, 12 pieces of switches that constitute demultiplexers are turned on and off to control the electrical coupling between wiring lines from the image signal line terminal VID and signal lines of the display region 30, which is not illustrated. Note that, in FIG. 3, bus line illustration is used from the partway for the purpose of easily recognizing the wiring lines of the 12 pieces of demultiplexer selection signals SEL1 to SEL12.

Furthermore, an up-down electrically continuous portion 43 is disposed at regions that overlap with four corners of the counter substrate 20. A counter electrode line 44 is coupled between the up-down electrically continuous portions 43. In addition, a first terminal group alignment mark 45 is disposed at both ends of the first terminal group 50 at the terminal portion 13. A second terminal group alignment mark 46 is disposed at both ends of the second terminal group 60 at the terminal portion 13.

The first terminal group 50 includes a plurality of first terminals 51 arranged at predetermined terminal pitches along the first side 130 of the element substrate 10. An input signal line for an AC signal is mainly coupled to each of the plurality of first terminals 51. Note that the AC signal includes: a start pulse signal DY, a clock signal CLY, an inverted clock signal CLYB, a scanning-direction assigning signal DIRY, and an enable signal ENBY, which are supplied to the scanning line driving circuit 41 through various types of control signal lines; image signals VID1 to VID160 supplied to the data line driving circuit 42 through the image signal lines; and demultiplexer selection signals SEL1 to SEL12 supplied through selection signal lines. In this embodiment, the first terminal group 50 includes 178 pieces of terminals including a dummy terminal DUM.

In FIG. 3, the DY represents a terminal into which the start pulse signal DY is inputted through the first connection wiring substrate 110, and is electrically coupled to the scanning line driving circuit 41 through the start pulse signal line. Similarly, the CLY represents a terminal into which a clock signal is inputted. The CLYB represents a terminal into which an inverted clock signal is inputted. The DIYR represents a terminal into which a scanning-direction assigning signal is inputted. The ENBY represents a terminal into which an enable signal is inputted. These terminals are electrically coupled to the scanning line driving circuit 41 through the clock signal line, the scanning-direction assigning signal line, and the enable signal line. In addition, the VID1 to VID160 each represent a terminal into which an image signal is inputted, and are electrically coupled to the data line driving circuit 42 through the image signal line VID. The SEL1 to SEL12 each represent a terminal into which a demultiplexer selection signal is inputted, and are each electrically coupled to the data line driving circuit 42 through the selection signal line. Note that a dummy terminal is inserted as appropriate in accordance with voltage in order to achieve reliability of insulation between terminals, and explanation thereof will not be given.

The second terminal group 60 includes a plurality of second terminals 61 arranged at predetermined terminal pitches along the first side 130 of the element substrate 10. An input line for power supply is mainly coupled to each of the plurality of second terminals 61. The power supply is to supply a predetermined voltage to a low power supply line VSSY, a high power supply line VDDY, a counter electrode line LCCOM, and a retention capacitor line CS (second retention capacitor line) of the scanning line driving circuit 41. In FIG. 3, the LCCOM is a terminal to which a potential of a counter electrode is supplied through the second connection wiring substrate 120. Similarly, the CS is a terminal to which a retention capacitor potential is supplied. The VSSY is a terminal to which a low potential power supply is supplied. The VDDY is a terminal to which a high potential power supply is supplied.

In this embodiment, the terminal pitch for the second terminal group 60 is four times wider than that for the first terminal group 50, and 45 pieces of terminals are provided. The second terminal group 60 is formed so as to have a wide space between terminals, which can accommodate four signal lines from the first terminal group 50. An electrostatic protection circuit group 140 for protecting an internal circuit from a surge entering from the AC signal terminal is disposed between the first terminal group 50 and the second terminal group 60.

The space between terminals in the first terminal group 50 and the second terminal group 60 need to be set to, for example, approximately 1600 μm in order to allow the ACF or the like to be appropriately affixed. Specifically, when the ACF or the first connection wiring substrate 110 is affixed to the first terminal group 50, a space is necessary between terminals, making it possible to prevent these from overlapping with the second terminal group 60. Furthermore, a space for the ACF or the second connection wiring substrate 120 to be appropriately affixed to the second terminal group 60 is necessary between terminals. By disposing the electrostatic protection circuit group 140 in this space between terminals, it is possible to achieve a configuration suitable to reduce the size of the liquid crystal panel 101.

A terminal for the counter electrode line LCCOM is disposed at left and right of the second terminal group 60. One terminal is provided for the retention capacitor line CS. Two terminals are provided for the high power supply line VDDY. The other terminals are provided for the low power supply line VSSY. The terminals for the low power supply line VSSY are disposed in a region that overlaps with the image signal line VID.

For example, the first terminal 51 that constitutes the first terminal group 50 has a terminal width of 40 μm, a space of 16 μm, a terminal pitch of 56 μm, and a terminal length of 500 μm. For example, the second terminal 61 that constitutes the second terminal group 60 has a terminal width of 150 μm, a space of 74 μm, a terminal pitch of 56×4 μm, and a terminal length of 500 μm. The distance (in other words, a space between terminals) between the first terminal group 50 and the second terminal group 60 is, for example, 1600 μm.

As described above, the space of the second terminal 61 is 74 μm. Thus, it is sufficiently possible to dispose four signal lines each having, for example, 10 μm in width. For example, when an aluminum wiring line passes through a section of 500 μm between second terminals 61, the resistance falls in approximately 5Ω. Thus, this does not cause any problem in terms of operation of an AC signal inputted from the first terminal 51.

Figure 4:
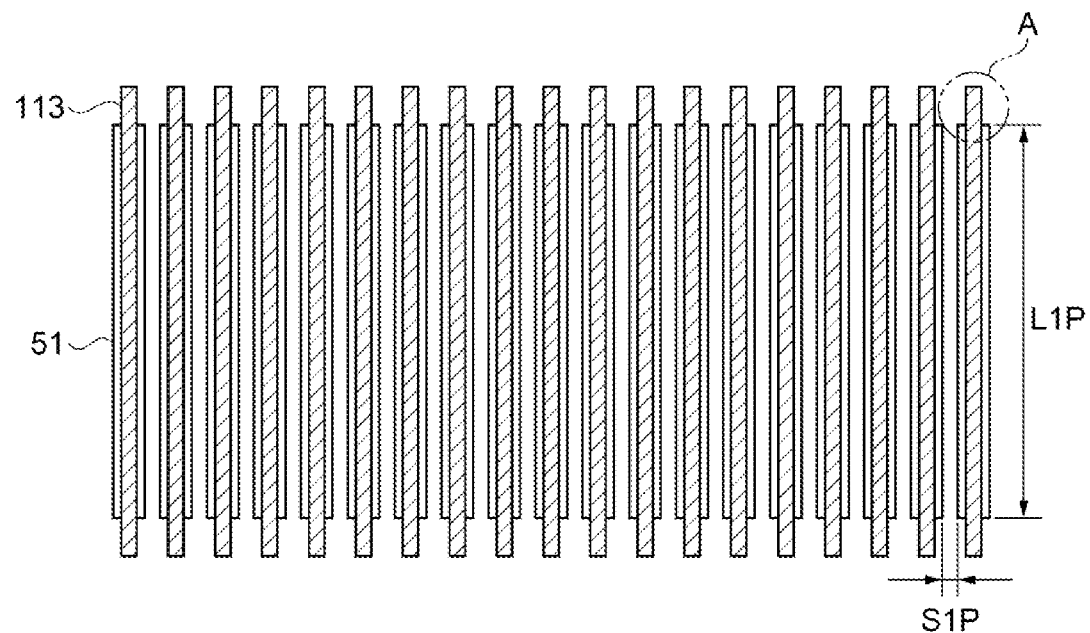
FIG. 4 is a diagram illustrating a state in which a first terminal group and a first connection terminal group are coupled.
Figure 5:
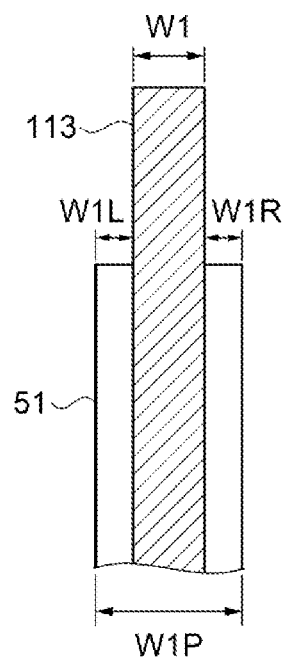
FIG. 5 is a diagram in which the portion A illustrated in FIG. 4 is enlarged.
Figure 6:
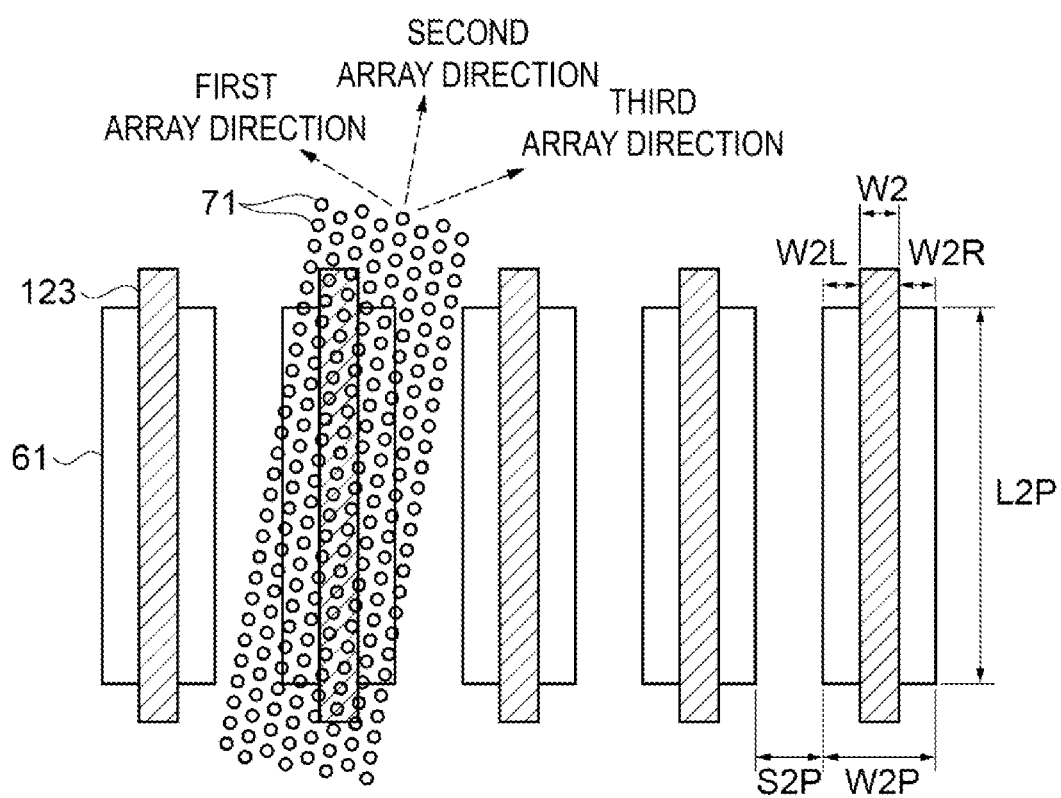
FIG. 6 is a diagram illustrating a state in which a second terminal group and a second connection terminal group are coupled.

FIG. 4 illustrates a state in which individual first terminals 51 that constitute the first terminal group 50 of the liquid crystal panel 101 and individual first connection terminals 113 that constitute the first connection terminal group 112 of the first connection wiring substrate 110 are coupled to each other. FIG. 5 illustrates the coupled state of FIG. 4, and the portion A in FIG. 4 is enlarged. FIG. 6 illustrates a state in which individual second terminals 61 that constitute the second terminal group 60 and individual second connection terminals 123 that constitute the second connection terminal group 122 are coupled to each other.

Here, as illustrated in FIGS. 4 and 5, the W1P represents a width of the first terminal 51. The L1P represents a length of the first terminal 51. The S1P represents a space between a first terminal 51 and an adjacent first terminal 51. The W1 represents a width of the copper foil pattern of the first connection terminal 113. Note that these W1P and W1 are dimensions of the top of the copper foil pattern of which cross-sectional shape substantially has a trapezoid shape. The alignment margin for the first connection terminal 113 is set as the W1L and the W1R. The terminal pitch (first terminal pitch) of the first terminal 51 is W1P+S1P.

Furthermore, as illustrated in FIG. 6, the W2P represents a width of the second terminal 61. The L2P represents a length of the second terminal 61. The S2P represents a space between a second terminal 61 and an adjacent second terminal 61. The W2 represents a width of the copper foil pattern of the second connection terminal 123. Note that these W2P and W2 are dimensions of the top of the copper foil pattern of which cross-sectional shape substantially has a trapezoid shape. Although it depends on the thickness of the copper foil pattern, on the assumption that the thickness of the copper foil pattern is, for example, 12 μm, the top dimension is smaller than the bottom dimension by approximately 5 μm. From the viewpoint of electrical coupling, the top dimension is important because the top dimension side is a side that is opposed to the second terminal 61. The alignment margin for the second connection terminal 123 is set as the W2L and the W2R. The terminal pitch (second terminal pitch) of the second terminal 61 is W2P+S2P.

Here, configuration is made such that W2P−W2>W1P−W1 is met. This configuration is set as a first configuration. Such a configuration provides the following operation.

For example, by setting 150 μm for the width W2P of the second terminal 61 and setting 50 μm for the width W2 of the second connection terminal 123, W2L+W2R=W2P−W2=100 μm is established. When it is ideally aligned, W2L=W2R=50 μm is established. Thus, acceptable misalignment toward either left or right direction is 50 μm.

Similarly, for example, by setting 40 μm for the width W1P of the first terminal 51 and setting 20 μm for the width W1 of the copper foil pattern of the first connection terminal 113, W1L+W1R=W1P−W1=20 μm is established. When it is ideally aligned, W1L=W1R=10 μm is established. Thus, acceptable misalignment toward either left or right direction is 10 μm. The tolerable dimension for misalignment of the second terminal 61 is greater than the tolerable dimension for misalignment of the first terminal 51. This makes it possible to significantly improve the mounting yield of the second connection wiring substrate 120.

Furthermore, here, configuration is made so as to meet an overlapping area between the terminal electrode of the second terminal 61 and the copper foil pattern of the second connection terminal 123>an overlapping area between the terminal electrode of the first terminal 51 and the copper foil pattern of the first connection terminal 113. In other words, L2P×W2>L1P×W1 is met.

This configuration is set as a second configuration. Such a configuration provides the following operation. Note that the overlapping area between the connection terminal and the copper foil pattern is also referred to as an "overlapping area with the copper foil pattern" or "overlapping area".

For example, by setting 500 μm for the length L2P of the second terminal 61 and setting 50 μm for the width W2 of the copper foil pattern of the second connection terminal 123, the overlapping area SP2 (SP2=L2P×W2) at the second terminal 61 is 500 μm×50 μm. Similarly, for example, by setting 500 μm for the length L1P of the first terminal 51 and setting 20 μm for the width W1 of the copper foil pattern of the first connection terminal 113, the overlapping area SP1 (SP1=L1P×W1) at the first terminal 51 is 500 μm×20 μm. Thus, SP2>SP1 is met.

Since SP2>SP1 is met for the overlapping area with the copper foil pattern, it is possible to increase the amount of collection of electrically conductive particles 71 in the ACF at the second terminal 61. This makes it possible to reliably enhance the electrical coupling at the second terminal 61, which leads to a significant improvement in the mounting yield of the second connection wiring substrate 120. In a case of particle-arrayed ACF, electrically conductive particles 71 are regularly arranged at constant pitches. Thus, the number of electrically conductive particles in the overlapping area with the copper foil pattern increases in proportion to the overlapping area, which results in a favorable configuration.

Here, electrically conductive particles 71 in the particle-arrayed ACF are arrayed in array directions (a first array direction to a third array direction), and the array directions are angled relative to the longitudinal direction of the second terminal 61 as typified by a second terminal 61 located at the second from the left in FIG. 6. At this time, these array directions of the electrically conductive particles 71 reliably intersect the direction in which the copper foil pattern of the second connection terminal 123 extends. This makes it possible to more reliably achieve the electrical coupling. Thus, by using the particle-arrayed ACF, it is possible to improve the mounting yield of the second connection wiring substrate 120. It is possible to employ any configuration in terms of array directions of particle-arrayed ACF. Note that it may be also possible to apply the particle-arrayed ACF to the first terminal 51.

Furthermore, even if the length L2P of the second terminal 61 is reduced, for example, to 400 μm, the overlapping area SP2 of the second terminal 61 is larger than the overlapping area SP1 of the first terminal 51. Since the length L2P of the second terminal 61 is reduced, it is also possible to suppress an increase in the size of the panel.

Here, configuration is made such that W2−S2P<W1−S1P is established, where the S1P is a space between first terminals 51 and the S2P is a space between second terminals 61. This configuration is set as a third configuration. Such a configuration provides the following operation.

For example, the width W2 of the copper foil pattern of the second connection terminal 123 is set to 50 μm. Furthermore, the space S2P between second terminals 61 is set to 74 μm. The probability that one copper foil pattern comes into contact with two adjacent second terminals 61 at the same time has a positive correlation with values of W2−S2P. In this case, W2−S2P=−24 μm holds, which is a negative value.

Similarly, for example, the width W1 of the copper foil pattern of the first connection terminal 113 is set to 20 μm. Furthermore, the space S1P between first terminals 51 is set to 16 μm. The probability that one copper foil pattern comes into contact with two adjacent first terminals 51 at the same time has a positive correlation with the value of W1−S1P. In this case, W1−S1P=4 μm holds, which is a positive value.

Thus, it is possible to set the second connection wiring substrate 120<the first connection wiring substrate 110 in terms of the probability that a copper foil pattern of a connection terminal comes into contact with two adjacent terminals at the same time. This increases the tolerance for alignment of the second connection wiring substrate 120, in particular, the tolerance for rotational displacement, improving the mounting yield of the second connection wiring substrate 120.

This embodiment is configured to meet all of the first configuration, the second configuration, and the third configuration. However, only one configuration of these configurations may be employed. In addition, any two configurations of these configurations may be combined. For example, as a typical configuration obtained by combining the first configuration and the third configuration, the terminal pitch between a second terminal 61 and an adjacent second terminal 61 may be set to be larger than the terminal pitch between a first terminal 51 and an adjacent first terminal 51. For example, by using W1=20 μm, W1P=40 μm, and S1P=16 μm, the terminal pitch of the first terminal 51 is set to 56 μm. In addition, by using W2=20 μm, W2P=150 μm, and S2P=74 μm, the terminal pitch of the second terminal 61 is set to 224 μm.

In this manner, a power supply terminal is disposed in the second terminal group 60. This configuration cuts 24 terminals in total in which the number of power supply terminals is six and the number of power supplies is four, as compared with the configuration in which all terminals are integrated in one terminal group at an array pitch of 56 μm. Thus, the width of the mounting region is reduced by approximately 1.4 mm. In addition, when all items are configured with one wiring substrate, 202 (=178+24) pieces of terminals are arranged at a pitch of 56 μm, which results in the width of the mounting region of approximately 11.3 mm. When the pixel pitch is, for example, 6 μm, the size of the pixel matrix (display region 30) is approximately 12 mm at the side of the long side. Thus, the width of the mounting region can be reduced by approximately 10% of this size. This allows a space for various types of marks or a test element group (TEG), which are essential in manufacturing, to be secured on and around the mounting region. Hence, this is a large effect. Thus, it is possible to reduce the size of the liquid crystal panel 101. By reducing the size of, in particular, the width direction of the liquid crystal panel 101, it is possible to reduce the size of the optical component in a projector serving as an electronic device on which the liquid crystal panel 101 is mounted. This makes it possible to achieve miniaturization of the projector. In addition, the second terminal 61 has a terminal pitch greater than that of the first terminal 51, and the number of terminals in the second terminal 61 is small, which significantly improves the mounting yield. Thus, it is possible to eliminate the need of repairing the mounting defect of the second connection wiring substrate 120. Furthermore, terminals for the stable low power supply lines VSSY are disposed in a region that overlaps with the image signal line VID. Thus, it is possible to suppress superimposed noises on the image signal line VID.

Figure 7:
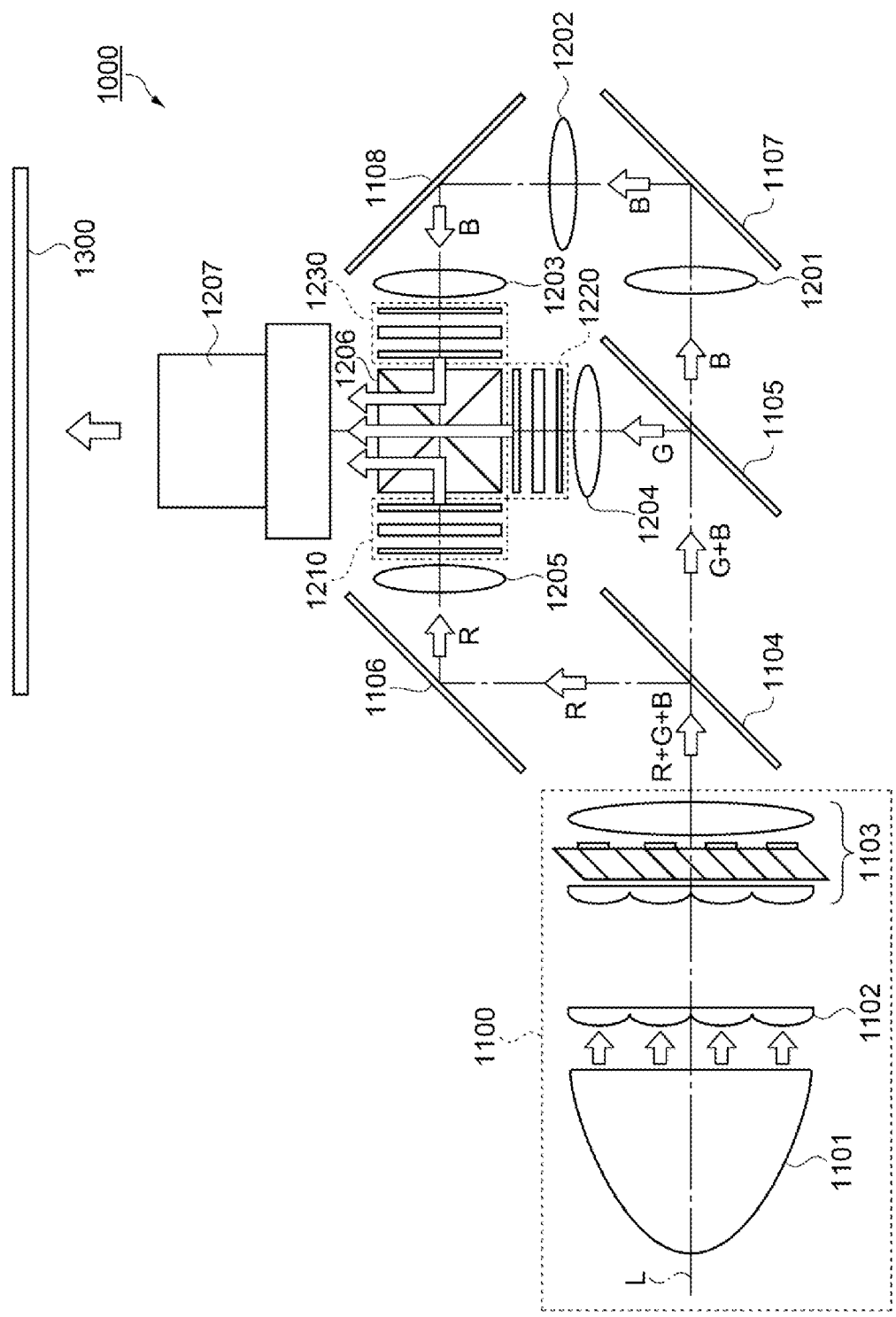
FIG. 7 is a schematic view illustrating a configuration of a projector serving as an electronic device.

As illustrated in FIG. 7, the projector 1000 serving as an electronic device according to this embodiment includes: a polarized light illumination device 1100 disposed along a system optical axis L; two dichroic mirrors 1104 and 1105 serving as a light separation element; three reflection mirrors 1106, 1107, and 1108; five relay lenses 1201, 1202, 1203, 1204, and 1205; transparent-type liquid crystal light valves 1210, 1220, and 1230 serving as three light modulation units; a cross dichroic prism 1206 serving as a light combining element; and a projection lens 1207.

The polarized light illumination device 1100 generally includes a lamp unit 1101 serving as a light source including a white light source such as an extra-high pressure mercury lamp or a halogen lamp, an integrator lens 1102, and a polarization conversion element 1103.

The dichroic mirror 1104 reflects the red light (R) of a polarized light flux exiting from the polarized light illumination device 1100, and transmits the green light (G) and the blue light (B). The other dichroic mirror 1105 reflects the green light (G) transmitted by the dichroic mirror 1104, and transmits the blue light (B).

The red light (R) reflected by the dichroic mirror 1104 is reflected by the reflection mirror 1106 and then enters the liquid crystal light valve 1210 by way of the relay lens 1205. The green light (G) reflected by the dichroic mirror 1105 enters the liquid crystal light valve 1220 by way of the relay lens 1204. The blue light (B) transmitted by the dichroic mirror 1105 enters the liquid crystal light valve 1230 via a light guide system including the three relay lenses 1201, 1202, and 1203 and the two reflection mirrors 1107 and 1108.

The liquid crystal light valves 1210, 1220, and 1230 are each disposed so as to be opposed to an incident surface of each type of color light of the cross dichroic prism 1206. The color light that has entered the liquid crystal light valves 1210, 1220, and 1230 is modulated on the basis of video information (video signal) and exits toward the cross dichroic prism 1206.

This prism includes four rectangular prisms bonded together. On inner surfaces of the prisms, a dielectric multilayer film configured to reflect the red light and a dielectric multilayer film configured to reflect the blue light are formed in a cross shape. These dielectric multilayer films combine the three types of color light to produce the combined light representing a color image. The combined light is projected onto a screen 1300 by the projection lens 1207 serving as a projection optical system, and an image is enlarged and is displayed.

The liquid crystal light valve 1210 is a light valve to which the liquid crystal device 500 described above is applied. The liquid crystal device 500 is disposed between a pair of polarizing elements disposed at the color-light entrance side and the exit side in a crossed-Nicols state and with a space being given from these elements. This similarly applies to the other liquid crystal light valves 1220 and 1230.

Note that, in addition to the projector 1000, the electronic device on which the liquid crystal device 500 is mounted includes various types of electronic devices such as a head-up display (HUD), a head-mounted display (HMD), a smartphone, an electrical viewfinder (EVF), a mobile mini-projector, an electronic book, a mobile phone, a mobile computer, a digital camera, a digital video camera, a display, an on-board device, an audio device, an exposure device, a lighting device, and the like.

As described above, the liquid crystal device 500 according to the first embodiment includes the liquid crystal panel 101. The liquid crystal panel 101 includes the first terminal group 50 including the first terminals 51, and the second terminal group 60 including the second terminals 61 located closer to the display region 30 side than the first terminal group 50. Here, configuration is made such that W2P−W2>W1P−W1 is established, where W1P is the width of the first terminal 51, W1 is the width of the copper foil pattern of the first connection terminal 113, W2P is the width of the second terminal 61, and W2 is the width of the copper foil pattern of the second connection terminal 123.

With this configuration, the tolerable dimension for misalignment of the copper foil pattern of the first connection terminal 113 relative to the second terminal 61 can be set to be greater than the tolerable dimension for misalignment of the copper foil pattern of the first connection terminal 113 relative to the first terminal 51. Thus, it is possible to suppress a reduction in the mounting yield of the second connection wiring substrate 120 caused by misalignment.

Furthermore, configuration is made such that L2P×W2>L1P×W1 is established, where L1P is the terminal length of the first terminal 51, and L2P is the terminal length of the second terminal 61.

With this configuration, the overlapping area with the copper foil pattern of the second connection terminal 123 at the second terminal 61 can be set to be greater than the overlapping area with the copper foil pattern of the first connection terminal 113 at the first terminal 51. Thus, it is possible to increase the amount of collection of electrically conductive particles in the ACF at the second terminal 61. This makes it possible to reliably enhance the electrical coupling at the second terminal 61, which leads to an improvement in the mounting yield of the second connection wiring substrate 120.

Furthermore, configuration is made such that W2−S2P<W1−S1P is established, where S1P is the terminal space of the first terminal 51, and S2P is the terminal space of the second terminal 61.

With this configuration, it is possible to set the second connection wiring substrate 120<the first connection wiring substrate 110 in terms of the probability that a copper foil pattern of a connection terminal comes into contact with two adjacent terminals at the same time. This increases the tolerance for alignment of the second connection wiring substrate 120, in particular, the tolerance for rotational displacement, improving the mounting yield of the second connection wiring substrate 120.

In addition, it is preferable that the terminal pitch between a second terminal 61 and an adjacent second terminal 61 is greater than the terminal pitch between a first terminal 51 and an adjacent first terminal 51.

With this configuration, the tolerable dimension for misalignment of the second connection wiring substrate 120 can be set to be greater than that of the first connection wiring substrate 110. Thus, it is possible improve the mounting yield of the second connection wiring substrate 120.

Figure 8:
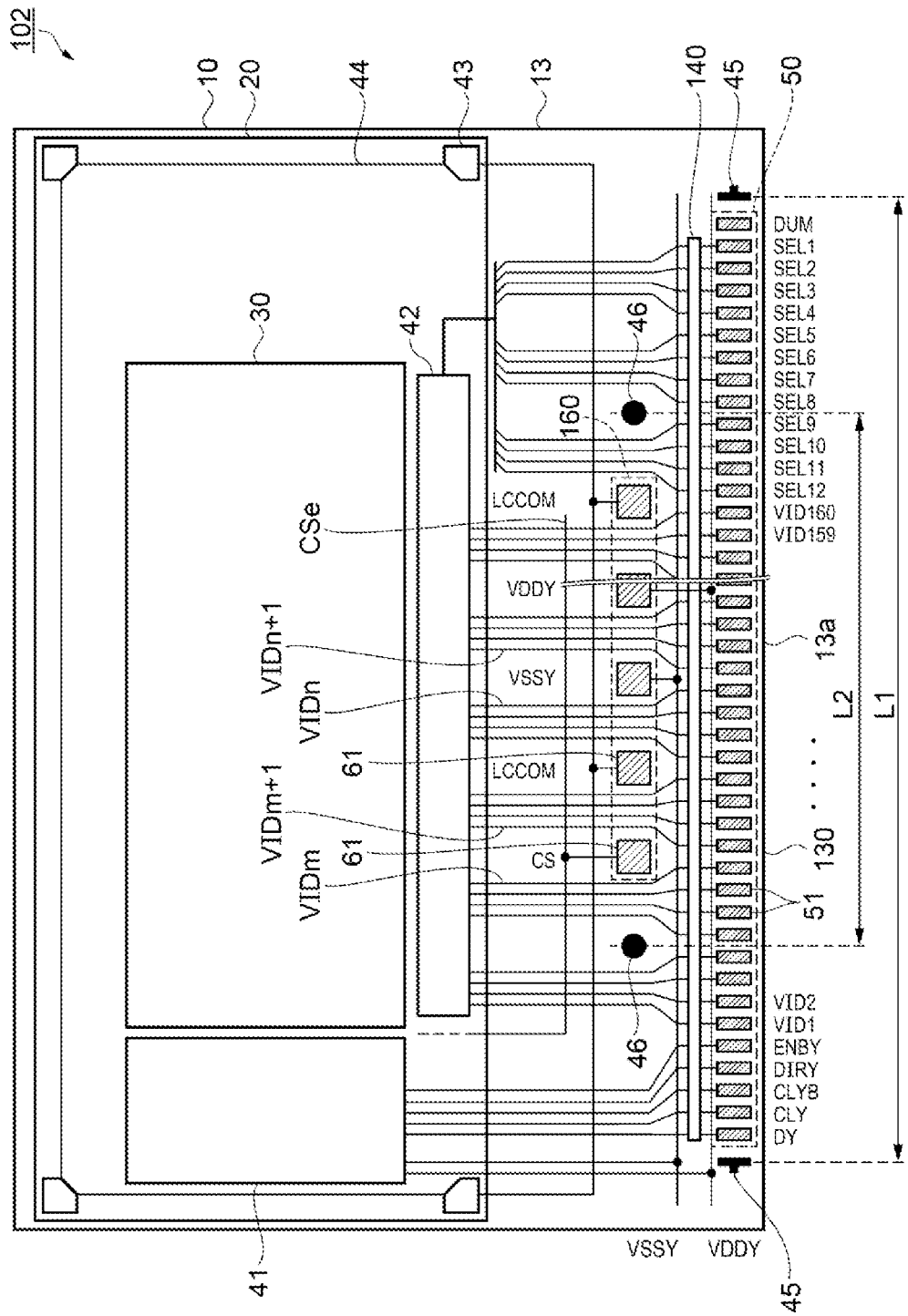
FIG. 8 is a plan view illustrating a configuration of a liquid crystal panel according to a second embodiment.

Furthermore, the terminal VSSY to which low potential power supply is provided is disposed between two image signal lines VIDn and VIDn+1 (see FIG. 8).

With this configuration, a terminal for the stable low power supply line VSSY is disposed in a region where image signal lines VID are disposed, which makes it possible to prevent the image signal lines VID from receiving an influence of noises.

In addition, since the liquid crystal device 500 described above is provided, it is possible to provide the projector 1000 with which display quality can improve.

As described above, with the configuration of the first embodiment, it is possible to provide an electro-optical panel, an electro-optical device, and an electronic device, in which two wiring substrates overlap with each other, and when these substrates are mounted so as to be close to each other, it is possible to improve the mounting yield of the wiring substrate mounted at the latter stage.

Second Embodiment

As illustrated in FIG. 8, a liquid crystal panel 102 according to a second embodiment differs from the liquid crystal panel 101 according to the first embodiment in that the width L2 of a second terminal group 160 is smaller than the width L1 of the first terminal group 50. These panels are similar in the other configurations. Thus, in the second embodiment, portions differing from those in the first embodiment will be described in detail, and the other overlapping portions will not be repeated as appropriate.

In a case of the liquid crystal panel 102 according to the second embodiment, the number of second terminals 61 reduces to 39 pieces of terminals, as compared with the liquid crystal panel 101 according to the first embodiment. Thus, the width of the second terminal group 160 reduces. In addition, the width L2 of the second terminal group 160 is smaller than the width L1 of the first terminal group 50, as can be understood from the distance between alignment marks 45, 46 for mounting as an indicator for the width of the terminal group.

The alignment marks 45 and 46 for mounting are usually disposed near the outermost terminals of the terminal group. Thus, it is rational to use the distance between the alignment marks 45, 46 for mounting, as the indicator for the width of the terminal group. The width of the terminal group is originally defined as the distance between the outermost end terminals of the terminal group.

That is, since the width of the terminal region portion at the second connection wiring substrate 120 reduces, it is possible to reduce the effect of the terminal region portion being extended resulting from heat applied at the time of mounting. Thus, it is possible to further suppress the misalignment, reducing the mounting defect. Since the width of the terminal region portion of the second terminal group 160 is small, it is typically preferable to set the external width of the second connection wiring substrate 120 to be smaller than the external width of the first connection wiring substrate 110 from the viewpoint of manufacturing cost. The alignment mark 46 for mounting is disposed between various types of signal lines from the first terminal 51. However, this is not mandatory. It may be possible to slightly space the mark apart from the second terminal 61 and dispose it so as to be shifted toward the outer end side of the liquid crystal panel 102 than various types of signal lines from the first terminal 51 and the power supply line.

In addition, the second terminal 61 coupled to the retention capacitor line CS is disposed between two image signal lines VIDm and VIDm+1 in a region where a plurality of image signal lines VID are disposed. The retention capacitor line CS includes a portion CSe that extends along the first side 130 so as to intersect all the image signal lines VID. Since the retention capacitor line CS intersects all the image signal lines VID, it is possible to equalize the influence of noises resulting from capacitive coupling between the retention capacitor line CSe and the image signal lines VID. This makes it possible to easily perform image correction or the like.

Furthermore, the second terminal 61 coupled to the retention capacitor line CS is disposed at the outermost end of the second terminal group 160. Since it is disposed at the outermost end of the second terminal group 160, the length of the retention capacitor line CS up to the display region 30 is short. Thus, the connecting resistance of the retention capacitor line CS reduces and the responsivity increases, which makes it possible to stably perform writing to the pixel 31. The second terminal 61 coupled to the retention capacitor line CS may be provided at the right side of the liquid crystal panel 102.

As described above, the width L2 of the second terminal group 160 of the liquid crystal panel 102 according to the second embodiment is narrower than the width L1 of the first terminal group 50.

With this configuration, the width L2 of the second terminal group 160 is narrower than the width L1 of the first terminal group 50. Thus, the influence of thermal extension of the second connection wiring substrate 120 is small, and misalignment is small.

In addition, it is preferable that the retention capacitor line CS is coupled to the second terminal 61 disposed at the outermost end of the second terminal group 160.

With this configuration, the terminal for the retention capacitor line CS is disposed at the outermost end of the second terminal group 160, which makes it possible to reduce the length of retention capacitor line CS being laid. Thus, the connecting resistance of the retention capacitor line CS reduces and the responsivity increases, which makes it possible to stably perform writing to the pixel 31.

In addition, it is preferable that the retention capacitor line CS is disposed so as to intersect the image signal lines VID.

With this configuration, the retention capacitor line CS is disposed so as to intersect the image signal lines VID. Thus, it is possible to equalize the influence of noises, for example, by configuring the line so as to intersect all the image signal lines VID. This makes it possible to easily perform image correction or the like.

Note that the present disclosure is not limited to the configuration of the second terminal group 60 according to the first embodiment described above or the configuration of the second terminal group 160 according to the second embodiment. The following configuration may be possible. FIGS. 9 to 14 are plan views illustrating configurations of liquid crystal panels 103, 104, 105, 106, 107, and 108 according to a first modification example to a sixth modification example.

Figure 9:
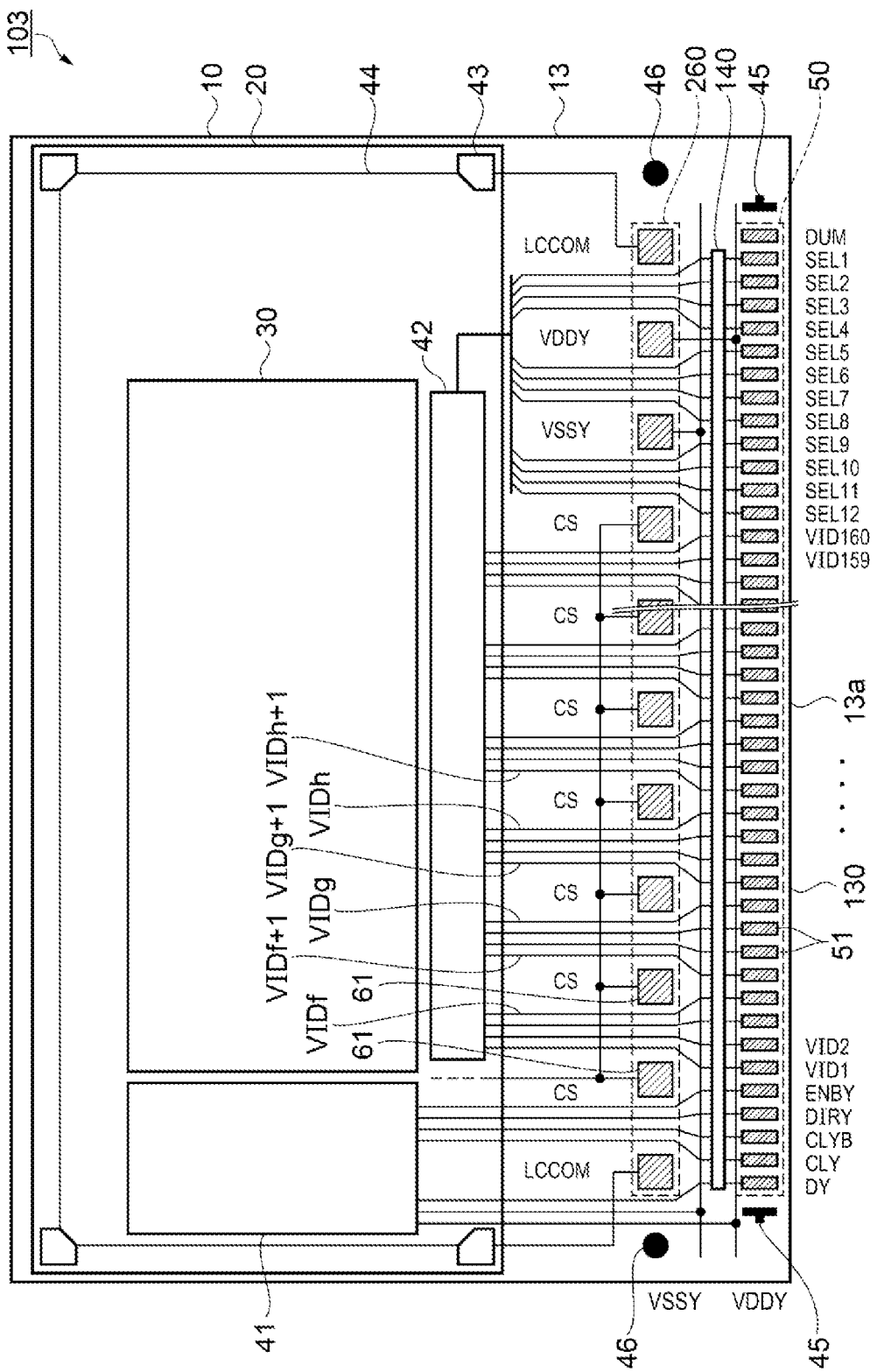
FIG. 9 is a plan view illustrating a configuration of a liquid crystal panel according to a first modification example.

In the liquid crystal panel 103 according to the first modification example illustrated in FIG. 9, the number of second terminals 61 allocated to retention capacitor lines CS in a second terminal group 260 increases, as compared with the first embodiment. The second terminal 61 coupled to the retention capacitor line CS is disposed between two image signal lines VIDf and VIDf+1, VIDg and VIDg+1, VIDh and VIDh+1, or the like in a region where a plurality of image signal lines VID are arranged, and 41 pieces of second terminals 61 in total are coupled to retention capacitor lines CS. In addition, the counter electrode line LCCOM is coupled to the second terminal 61 at two locations that are at corresponding ends of the second terminal group 260.

The liquid crystal panel 103 includes a common-inversion drive. When inversion drive is performed to the retention capacitor line CS and the counter electrode line LCCOM at the same voltage amplitude in accordance with polarities, there is a problem in that polarity balance of voltage application to liquid crystals cannot be successfully kept due to parasitic capacitor with a gate line at a fixed potential in a pixel circuit in a retained state. Thus, in order to maintain balance between an applied voltage at the time of positive polarity and an applied voltage at the time of negative polarity, there is a configuration in which inversion drive is performed at different voltage amplitudes between the counter electrode line LCCOM and the retention capacitor line CS. For this reason, in the liquid crystal panel 103 according to the first modification example, the counter electrode line LCCOM and the retention capacitor line CS are separate. At this time, the driving load of the retention capacitor line CS is large. In addition, the retention capacitor line CS is at a reference voltage for pixel voltage at the time of writing. Thus, by allocating a large number of second terminals 61 to the retention capacitor lines CS as illustrated in FIG. 9, the connecting resistance of the retention capacitor line CS reduces and the responsivity increases, which makes it possible to stably perform pixel writing.

The retention capacitor line CS intersects all the image signal lines VID. The retention capacitor line CS is a power supply on which noises are most likely to be superimposed. However, since the retention capacitor line CS intersects all the image signal lines VID, it is possible to equalize the influence of noises. This makes it possible to easily perform image correction or the like.

Furthermore, it is preferable that a plurality of second terminals 61 coupled to retention capacitor lines CS are disposed in a region of the second terminal group 260 where the image signal lines VID are disposed.

With this configuration, since a plurality of second terminals 61 coupled to retention capacitor lines CS are disposed in a region where the image signal lines VID are disposed, it is possible to reduce the connecting resistance of the retention capacitor lines CS, and increase the responsivity. This makes it possible to stably perform writing to the pixel 31.

In addition, in FIG. 9, it is preferable that the plurality second terminals 61 include terminals each allocated to the counter electrode line LCCOM and the retention capacitor line CS, and the number of second terminals 61 allocated to the retention capacitor lines CS is greater than the number of second terminals 61 allocated to the counter electrode lines LCCOM.

With this configuration, the counter electrode lines LCCOM and the retention capacitor lines CS are separately provided. Thus, for example, in a case of performing common-inversion drive, it is possible to apply different voltages to respective lines. In addition, since the number of second terminals 61 allocated to the retention capacitor lines CS is large, the connecting resistance can be reduced, which makes it possible to stably perform writing to the pixel 31.

Figure 10:
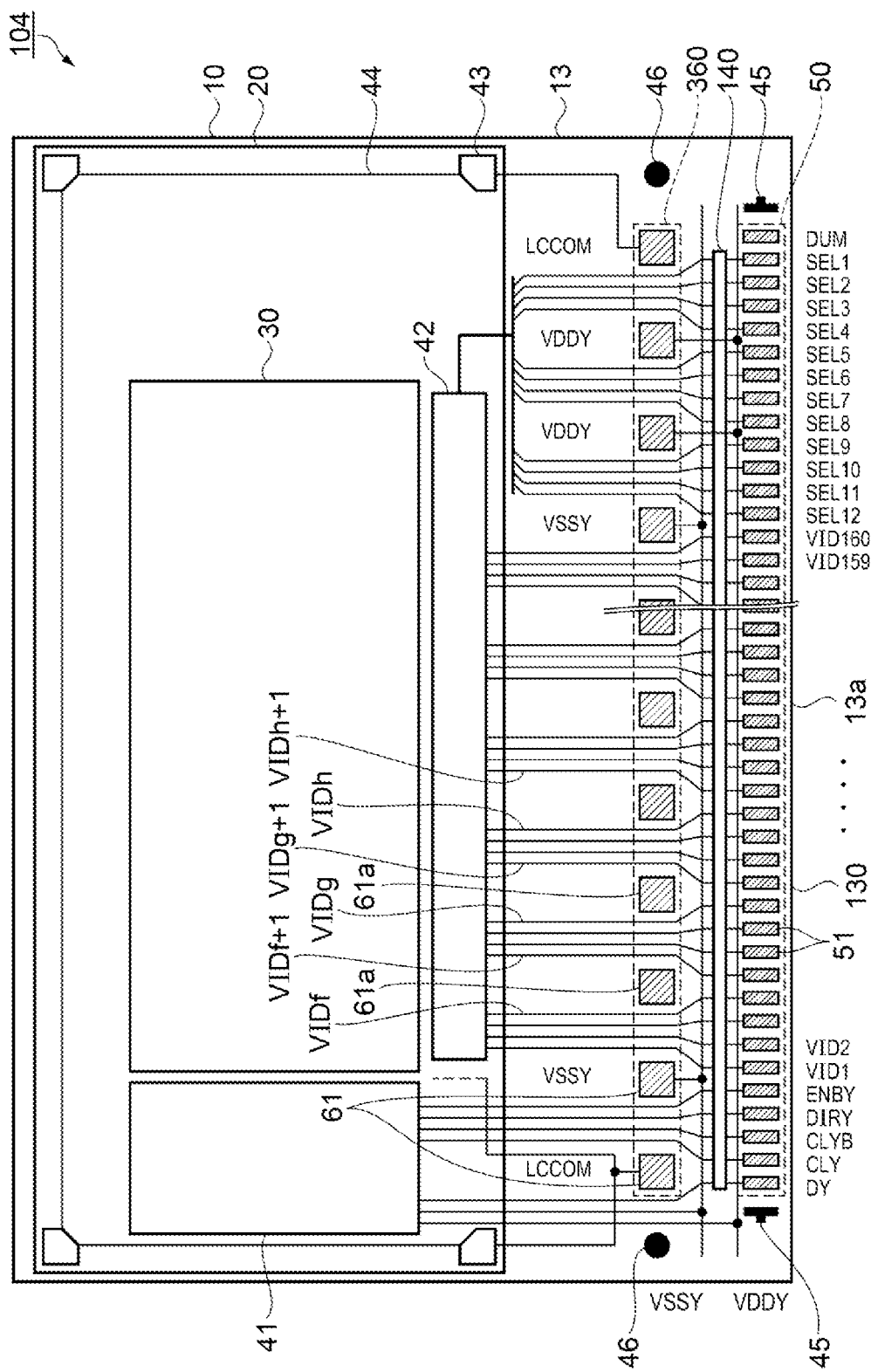
FIG. 10 is a plan view illustrating a configuration of a liquid crystal panel according to a second modification example.

In a case of a liquid crystal panel 104 according to a second modification example illustrated in FIG. 10, as compared with the first embodiment, when common-inversion drive is not performed, the counter electrode line LCCOM is configured to be the same as the retention capacitor line CS that is not illustrated. In a second terminal group 360, terminals for the low power supply lines VSSY are disposed in second terminals 61 located at both ends of the group of image signal lines VID. The second terminals 61 in a region of the group of image signal lines VID are dummy terminals 61a.

The dummy terminal 61a is disposed between two image signal lines VIDf and VIDf+1, VIDg and VIDg+1, VIDh and VIDh+1 or the like in a region where a plurality of image signal lines VID are disposed. Any given stable power supply generated by an upper circuit configured to drive the liquid crystal panel 104 may be supplied to the dummy terminal 61a, or the dummy terminal 61a may be floating. In any case, it has a configuration that avoids input of power supply having a large amount of noises. This makes it possible to avoid superimposing of noises to the image signal lines VID. Note that the second terminal 61 (dummy terminal 61a) itself may not be provided.

Figure 14:
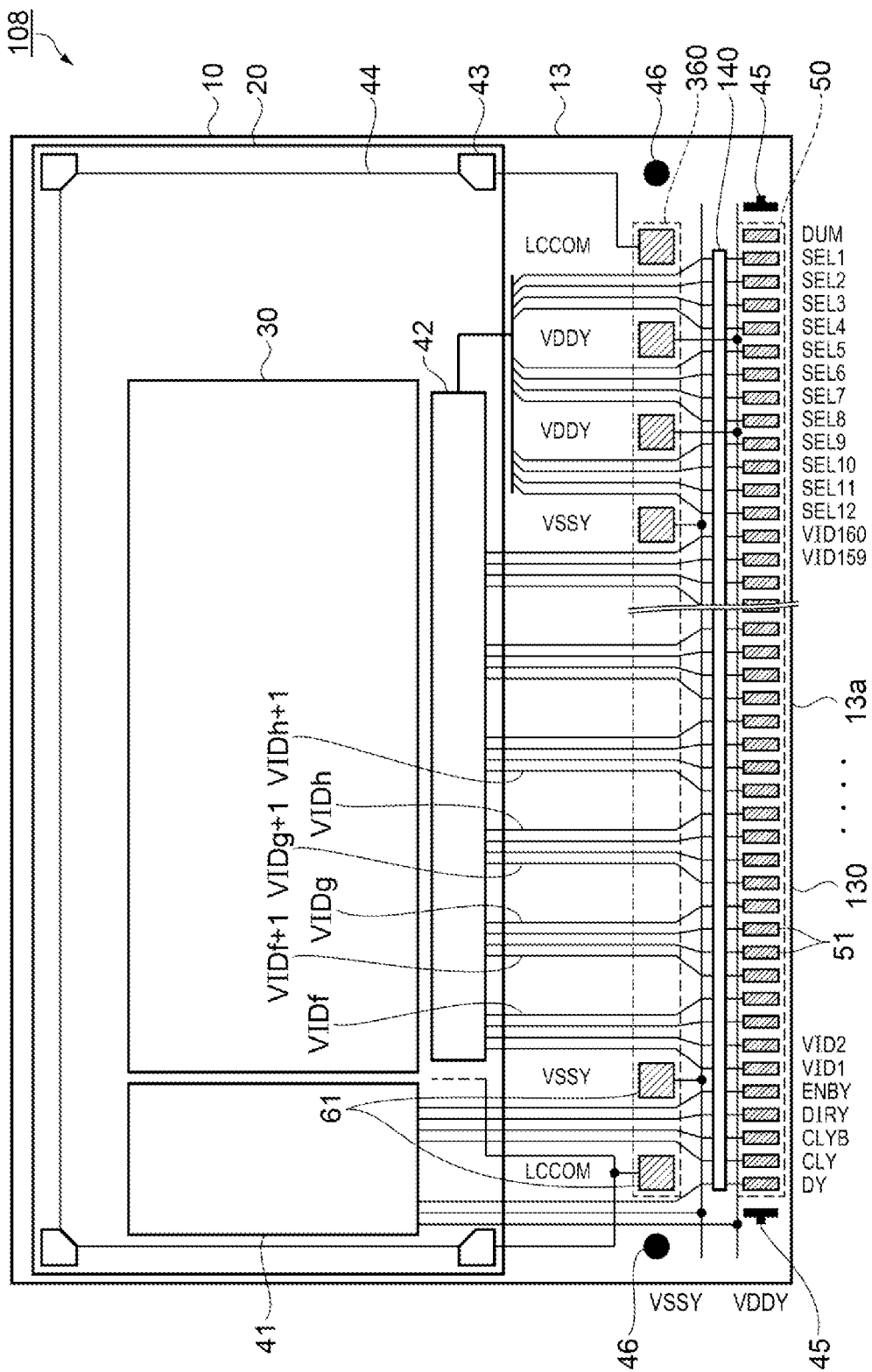
FIG. 14 is a plan view illustrating a configuration of a liquid crystal panel according to a sixth modification example.

In a liquid crystal panel 108 according to a sixth modification example illustrated in FIG. 14, no second terminal 61 (including a dummy terminal 61a) is disposed in a wiring line region for image signal lines VID. A blank space exists between two image signal lines VIDf and VIDf+1, VIDg and VIDg+1, VIDh and VIDh+1 or the like in a region where a plurality of image signal lines VID are disposed. Note that it may be possible to eliminate the space and arrange the image signal lines VID at equal intervals.

Furthermore, it is preferable that the dummy terminal 61a is disposed in a region of the second terminal group 360 where the image signal lines VID are arranged.

With this configuration, since the dummy terminal 61a is disposed in a region where the image signal lines VID are arranged, it is possible to prevent the image signal lines VID from receiving the influence of noises.

In addition, it is preferable that the second terminal 61 is not disposed in the region of the second terminal group 360 where the image signal lines VID are arranged.

With this configuration, since the second terminal 61 is not disposed in the region where the image signal lines VID are arranged, it is possible to prevent the image signal lines VID from receiving the influence of noises. In addition, this makes it easy to place the incoming wiring lines of the image signal lines VID to the data line driving circuit 42.

In addition, it is preferable that the second terminal group 360 is configured such that the counter electrode line and the retention capacitor line are coupled to a common LCCOM terminal, and the region where image signal lines VID are arranged includes a dummy terminal 61a.

With this configuration, since the dummy terminal 61a is disposed in the region where the image signal lines VID are arranged, it is possible to prevent the image signal lines VID from receiving the influence of noises.

Figure 11:
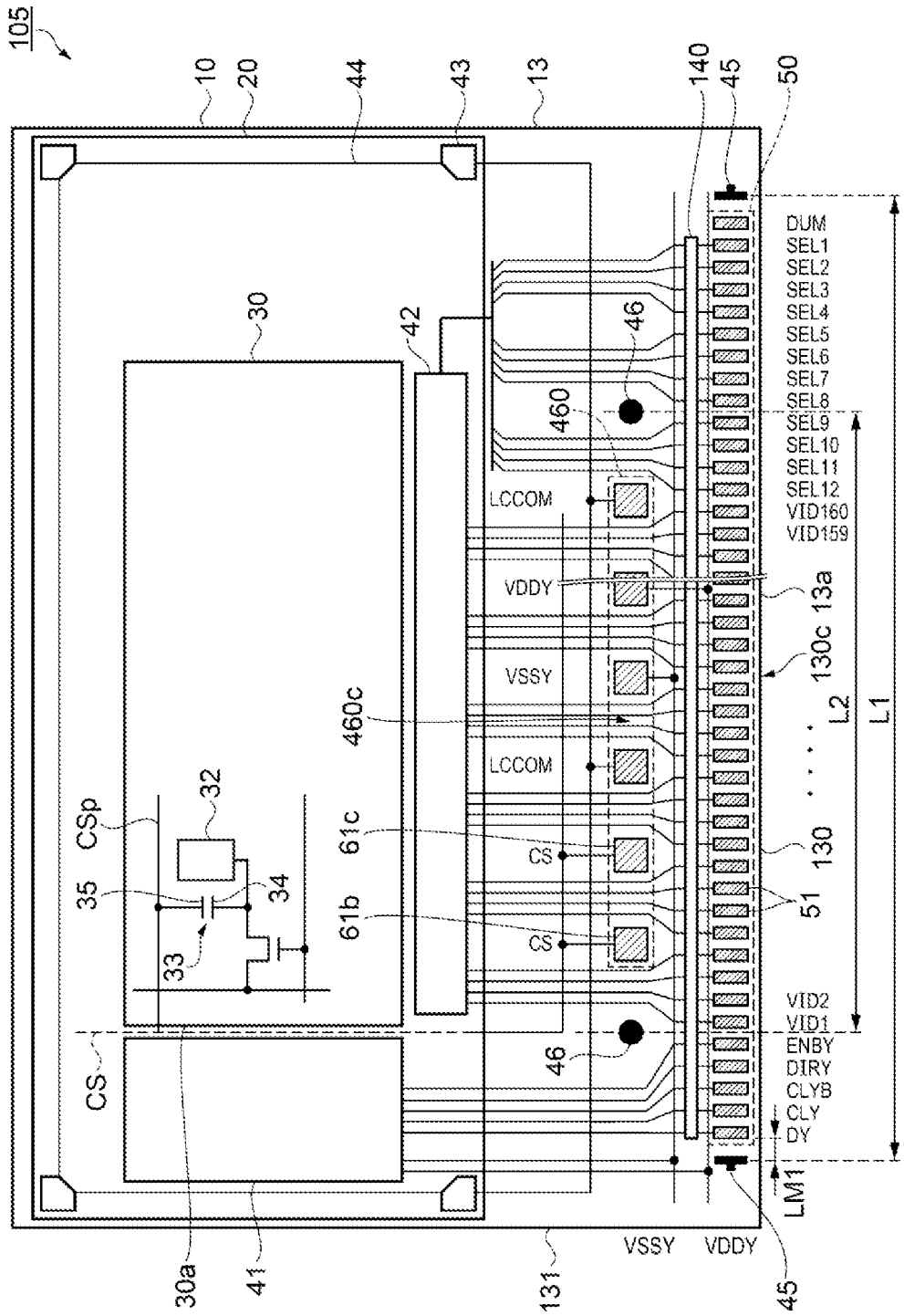
FIG. 11 is a plan view illustrating a configuration of a liquid crystal panel according to a third modification example.

In a liquid crystal panel 105 according to a third modification example illustrated in FIG. 11, the retention capacitor line CS corresponding to the second retention capacitor line is coupled to two second terminals 61b and 61c. The second terminal 61*b* is disposed at the outermost end of the plurality of second terminals 61 of a second terminal group 460, the outermost end being located at the side closest to the second side 131 side of the liquid crystal panel 105.

In FIG. 11, a pixel electrode 32, a retention capacitor 33, and a retention capacitor line CSp serving as a first retention capacitor line are disposed in the display region 30. A first electrode 34 of the retention capacitor 33 is coupled to the pixel electrode 32. A second electrode 35 of the retention capacitor 33 is coupled to the retention capacitor line CSp. The retention capacitor line CSp is coupled to the retention capacitor line CS at a position of the display region 30 located at one side in the direction (X direction) in which the first side 130 extends, in other words, at a position along a side 30*a* of the display region 30 at the scanning line driving circuit 41 side. A retention capacitor potential CS is supplied to the retention capacitor line CSp of the display region 30 from a position of the side 30*a* located at one side of the display region 30.

The second terminal group 460 has the center position 460*c* disposed so as to be shifted toward the side 30*a* side (left side in FIG. 11) of the display region 30 from the midpoint 130*c* of the first side 130. By disposing the second terminal group 460 in a shifted manner, it is possible to shorten the distance between the second terminal 61*b*, 61*c* and the second retention capacitor line CSp. This makes it possible to further reduce the driving load of the retention capacitor line CS coupling them and increase the responsivity, which makes it possible to stably perform writing to a pixel.

Furthermore, it is preferable to employ a configuration in which the number of second terminals 61 coupled to the retention capacitor line CS is plural or more, in particular, when common-inversion drive is employed. This is because, at the time of common-inversion drive, the driving load of the retention capacitor line CS increases, and the retention capacitor line CS is at a reference voltage for pixel voltage at the time of writing. Furthermore, due to synergistic effect with the configuration in which the second terminal group 460 is disposed in a shifted manner, the driving load of the retention capacitor line CS further reduces and the responsivity further increases. This makes it possible to stably perform pixel writing.

In addition, it is preferable that the second terminal group 460 is disposed so as to be shifted toward a side at which the retention capacitor line CS is laid.

With this configuration, since the second terminal group 460 is shifted toward the side at which the retention capacitor line CS is laid, it is possible to shorten the length of laid wiring line of the retention capacitor line CS. Thus, the connecting resistance of the retention capacitor line CS reduces and the responsivity increases, which makes it possible to stably perform writing to the pixel 31.

Figure 12:
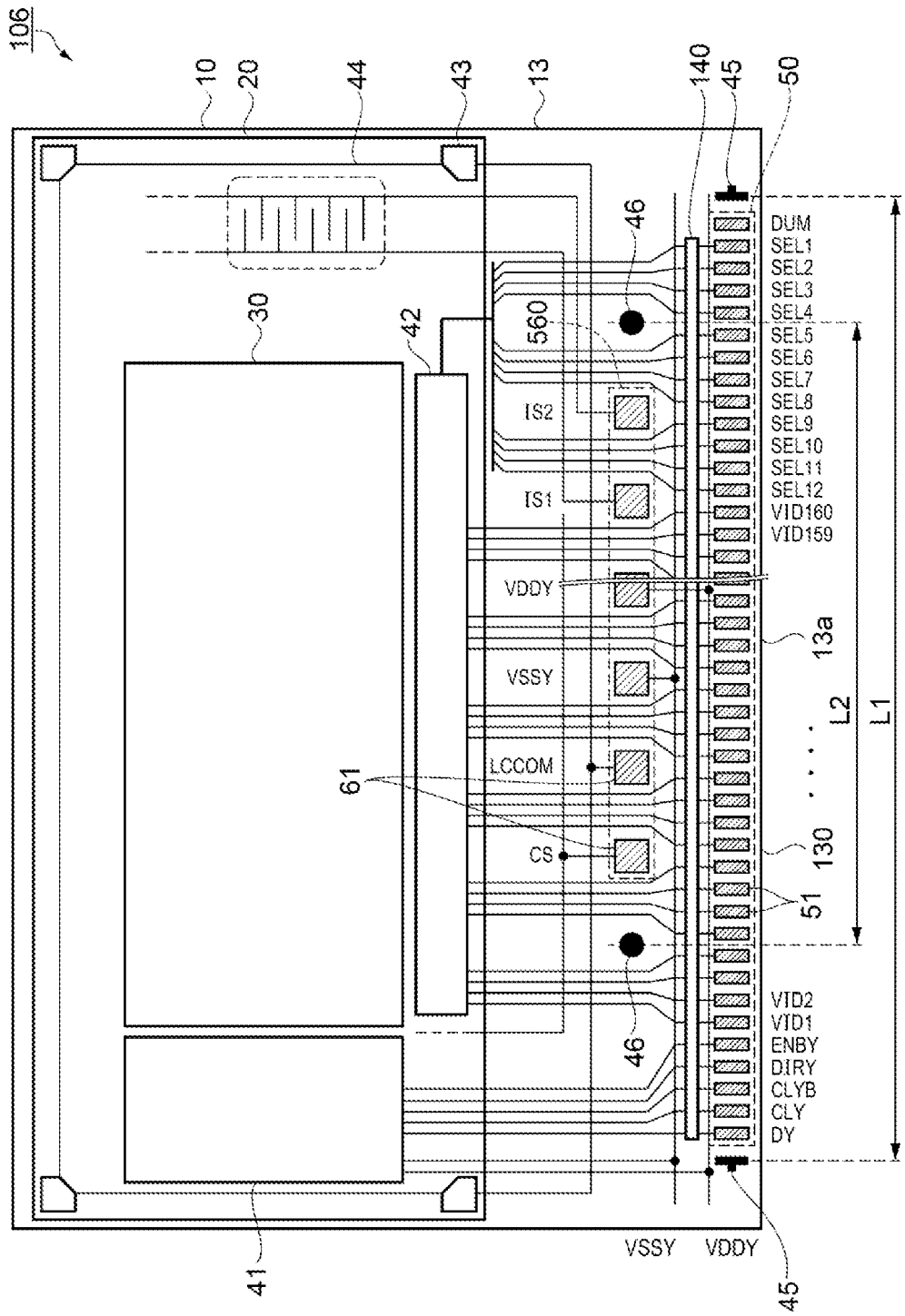
FIG. 12 is a plan view illustrating a configuration of a liquid crystal panel according to a fourth modification example.

In a liquid crystal panel 106 according to a fourth modification example illustrated in FIG. 12, AC signal lines IS1 and IS2 serving as wiring lines for an AC signal are allocated in a second terminal group 560, as compared with the second embodiment. The AC signal lines IS1 and IS2 are used for an AC signal having relatively low frequencies to cause impurity ions in liquid crystal to be discharged to the outside of the display region 30. The AC signal lines IS1 are IS2 are coupled to pixel electrode layer patterns that engage with each other in a comb teeth manner. In FIG. 12, only a portion of the patterns are illustrated. However, the comb teeth patterns are provided so as to generally surround the entire display region 30.

By using an electric field with this electrode, impurity ions are guided to the outside of the display region 30. This suppresses display stain or the like, and extends display life of the liquid crystal panel 106. The number of second terminals 61 is sufficient in terms of the predetermined number of power supply. Thus, by allocating a portion of AC signal lines to the second terminal group 560, the size of the width of the first connection wiring substrate 110 is reduced. At the same time, the width of the second connection wiring substrate 120 is narrow, which makes it possible to enhance the mounting yield.

The number of terminals for an AC signal integrated on the first connection wiring substrate 110 is greater than that of the second connection wiring substrate 120. Thus, the first connection wiring substrate 110 may have a form of chip on film (COF). On the other hand, the second connection wiring substrate 120 is used for power supply, which is a simple AC signal, and hence, may have a form of FPC. When the first connection wiring substrate 110 and the second connection wiring substrate 120 are mounted so as to overlap with each other, the surface (surface on which a copper foil is formed) of the wiring line pattern of the second connection wiring substrate 120 cannot be viewed at the time of viewing from the surface (surface on which a copper foil is formed) of the wiring line pattern of the first connection wiring substrate 110. This leads to a problem in that signals cannot be monitored on the second connection wiring substrate 120. However, the first connection wiring substrate 110 has more terminals for an AC signal integrated thereon than the second connection wiring substrate 120. This allows the wiring line pattern on the first connection wiring substrate 110 to be probed, which makes it easy to monitor signals. Note that it is not prohibited to dispose a terminal for power supply on the first connection wiring substrate 110. For example, it may be possible to dispose, on the first terminal group 50, terminals for any of or two or more of the low power supply line VSSY, the high power supply line VDDY, the counter electrode line LCCOM, and the retention capacitor line CS.

It is preferable that the number of second terminals 61 coupled to the AC signal line in the second terminal group 560 is smaller than the number of first terminals 51 coupled to the AC signal line in the first terminal group 50.

With this configuration, in other words, the percentage of power supply lines being disposed in the second terminal group 560 increases. This results in an increase in cases where the same power supply line is coupled to adjacent second terminals 61. Although low resistance connection is required for the power supply, the probability of the low-resistance connection increases with increase in the number of allocated terminals. Thus, the margin of connection increases, which improves the mounting yield of the second terminal group 560.

In addition, it is preferable that the second terminal group 560 includes the second terminal 61 coupled to the AC signal line IS1, IS2 used to discharge impurity ions.

With this configuration, impurity ions can be guided to the outside of the display region 30, which makes it possible to suppress display defect such as stain. The AC signal lines IS1 and IS2 are used for a low-frequency signal. Thus, it is easy to supply the signal from a drive substrate of the liquid crystal panel 106 through the FPC, and it is not necessary for the second connection wiring substrate 120 to employ COF.

Figure 13:
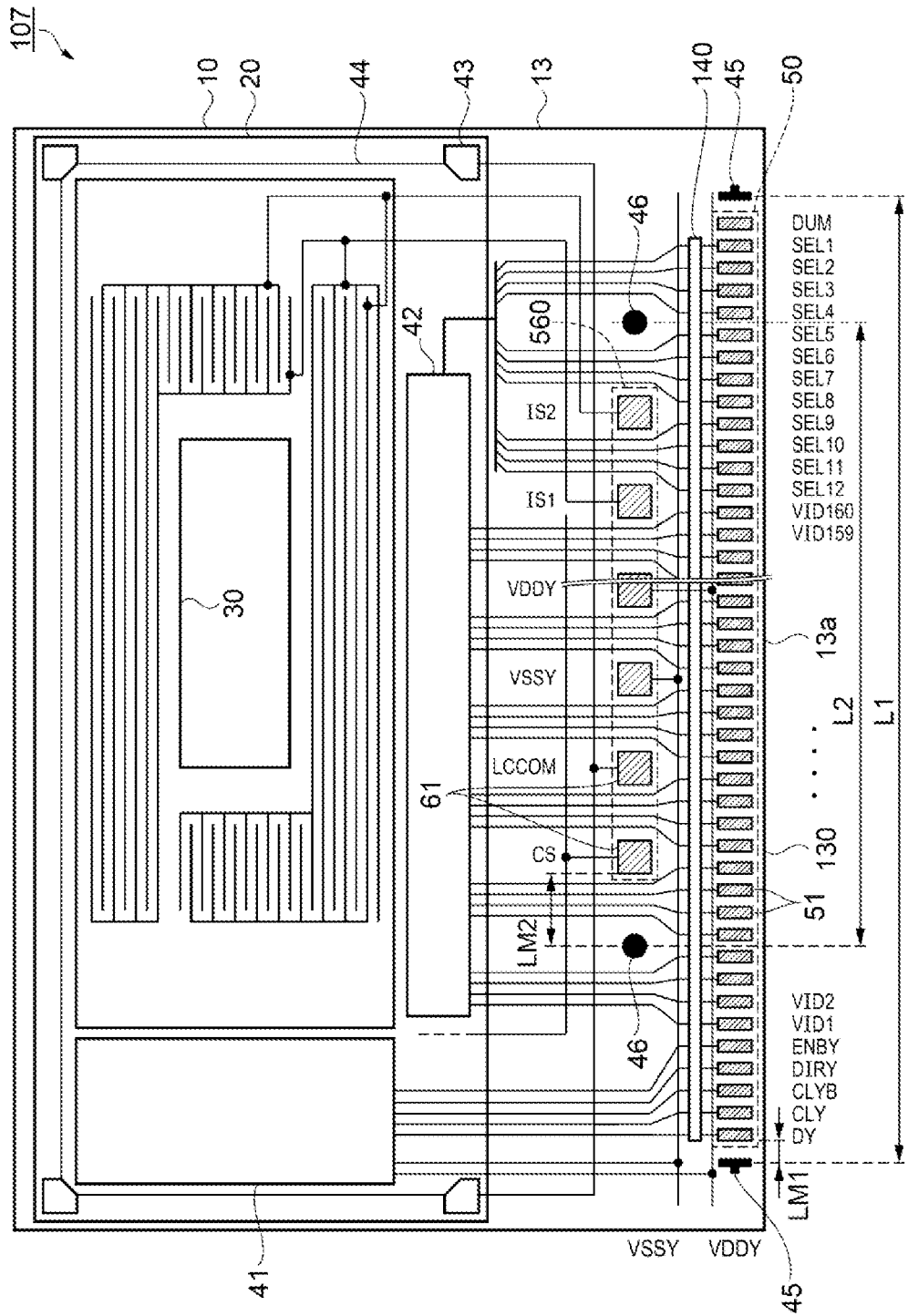
FIG. 13 is a plan view illustrating a configuration of a liquid crystal panel according to a fifth modification example.

In addition, as with a liquid crystal panel 107 according to a fifth modification example illustrated in FIG. 13, wiring lines coupled to the AC signal lines IS1 and IS2 may be configured to have a layout as illustrated in the drawing.

What is claimed is:

1. An electro-optical device comprising:
an electro-optical panel comprising:
a display region;
a first terminal group including a plurality of first terminals arranged along a first side of the electro-optical panel; and
a second terminal group disposed between the first terminal group and the display region and including a plurality of second terminals arranged along the first side;
a first wiring substrate including a first external terminal electrically coupled to the first terminal of the first terminal group; and
a second wiring substrate including a second external terminal electrically coupled to the second terminal of the second terminal group, wherein
a number of the plurality of second terminals is smaller than a number of the plurality of first terminals, and
a difference between a width of the second terminal and a width of the second external terminal is greater than a difference between a width of the first terminal and a width of the first external terminal.

2. The electro-optical device according to claim 1, wherein
the plurality of first terminals are arranged in the first terminal group at a first terminal pitch, and
the plurality of second terminals are arranged in the second terminal group at a second terminal pitch greater than the first terminal pitch.

3. The electro-optical device according to claim 1, wherein
a width of each of the plurality of second terminals is wider than a width of each of the plurality of first terminals.

4. The electro-optical device according to claim 1, wherein
a width of the second terminal group is narrower than a width of the first terminal group.

5. The electro-optical device according to claim 1, wherein
a number of terminals supplied with power from the second wiring substrate, among the plurality of second terminals, is greater than a number of terminals supplied with power from the first wiring substrate among the plurality of first terminals.

6. The electro-optical device according to claim 1, comprising:
a pixel electrode disposed in the display region;
a first retention capacitor line disposed in the display region and supplied with a predetermined potential;
a retention capacitor including a first electrode coupled to the pixel electrode and a second electrode coupled to the first retention capacitor line;
a retention capacitor terminal included in the plurality of second terminals and supplied with the predetermined potential; and
a second retention capacitor line configured to electrically couple the first retention capacitor line and the retention capacitor terminal.

7. The electro-optical device according to claim 6, wherein
the retention capacitor terminal is disposed on an outermost side among the plurality of second terminals included in the second terminal group.

8. The electro-optical device according to claim 7, wherein
the second retention capacitor line is coupled to the first retention capacitor line at one side of the display region in an extension direction of the first side, and
the second terminal group has a center position disposed so as to be shifted from a midpoint of the first side toward the one side of the display region in the extension direction of the first side.

9. The electro-optical device according to claim 6, comprising:
a data line driving circuit;
a plurality of image signal terminals included in the plurality of first terminals and supplied with an image signal; and
a plurality of image signal lines configured to electrically couple the plurality of image signal terminals and the data line driving circuit.

10. The electro-optical device according to claim 9, wherein
the second retention capacitor line is disposed so as to intersect the plurality of image signal lines.

11. The electro-optical device according to claim 9, wherein
a terminal included in the plurality of second terminals and coupled to a low potential power supply is disposed between two image signal lines of the plurality of image signal lines.

12. The electro-optical device according to claim 9, wherein
a terminal included in the plurality of second terminals and coupled to the second retention capacitor line is disposed between two image signal lines of the plurality of image signal lines.

13. The electro-optical device according to claim 9, wherein
a dummy terminal is disposed between two image signal lines of the plurality of image signal lines.

14. The electro-optical device according to claim 9, wherein
the second terminal is not disposed between the plurality of image signal lines.

15. The electro-optical device according to claim 9, comprising:
a counter electrode line electrically coupled to a counter electrode, wherein
a number of terminals included in the plurality of second terminals and coupled to the second retention capacitor line is greater than a number of terminals coupled to the counter electrode line.

16. An electronic device comprising:
the electro-optical device according to claim 1.

* * * * *